(12) United States Patent
Hoang et al.

(10) Patent No.: US 8,237,525 B2
(45) Date of Patent: Aug. 7, 2012

(54) DEVICE HAVING A SHAPE MEMORY ELEMENT

(75) Inventors: Anh-Tuan Hoang, Tamm (DE); Martin Maier, Moeglingen (DE); Guenther Hohl, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 1003 days.

(21) Appl. No.: 11/793,086

(22) PCT Filed: Oct. 5, 2005

(86) PCT No.: PCT/EP2005/055012
§ 371 (c)(1),
(2), (4) Date: Aug. 4, 2008

(87) PCT Pub. No.: WO2006/063877
PCT Pub. Date: Jun. 22, 2006

(65) Prior Publication Data
US 2009/0033448 A1    Feb. 5, 2009

(30) Foreign Application Priority Data

Dec. 16, 2004 (DE) .......................... 10 2004 060 532

(51) Int. Cl.
*H01F 7/00* (2006.01)
*H01H 55/00* (2006.01)
(52) U.S. Cl. ........................... 335/215; 335/220; 310/26
(58) Field of Classification Search .......... 335/220–229, 335/215; 310/26
See application file for complete search history.

(56) References Cited

U.S. PATENT DOCUMENTS

| 6,803,846 B2 * | 10/2004 | Ohta et al. ..................... 335/215 |
| 2003/0057394 A1 | 3/2003 | Makino |

FOREIGN PATENT DOCUMENTS

| DE | 103 17 149 | 10/2004 |
| JP | 2001280215 | 10/2001 |

* cited by examiner

*Primary Examiner* — Bernard Rojas
(74) *Attorney, Agent, or Firm* — Kenyon & Kenyon LLP

(57) ABSTRACT

Conventional devices have a valve needle and a shape memory element which, by the application of a controllable magnetic field, executes a control stroke travel that operates the actuator, and having a coil that excites the magnetic field which is situated in a magnet housing which, at its end face, is bordered with respect to an actuating axis by a front wall in each case, the front walls having a through opening radially within the coil. It is a disadvantage that the magnetic field excited around the coil is conducted unfavorably, so that at most a slight magnetic field develops in the shape memory element. The shape memory element has a magnetic field flowing through it, in the direction of its longitudinal extension, if at all. Since the shape memory element has a high magnetic resistance and is developed to be very long in the axial direction, only a very weak magnetic field can be induced in the shape memory element. In response to the magnetic field that is weak at most, the shape memory element can generate only a very slight lift of the valve needle. In the device according to the present invention, a strong magnetic field is conducted through the shape memory elements, and in this way, a large control stroke travel is achieved. The shape memory element(s) is/are positioned generally only in the through opening(s).

10 Claims, 7 Drawing Sheets

DEVICE HAVING A SHAPE MEMORY ELEMENT

FIELD OF THE INVENTION

The present invention relates to a device having a shape memory.

BACKGROUND INFORMATION

A device is described in JP 2001280215 A which has a valve needle and a shape memory element that, by the application of a controllable magnetic field, carries out a control stroke travel that operates the valve needle, and a coil that excites the magnetic field, which is situated in a magnet housing which is limited at its end face with respect to its actuating axis by a front wall, in each case, the two front walls having a through opening within the coil. The control stroke travel is achieved by the shortening of the shape memory element in the direction of a actuating axis of the valve needle. The disadvantage is that, because of the selected positioning of metallic elements and air gaps, the magnetic field excited around the electric coil develops at most a slight magnetic field in the shape memory element. The shape memory element has a magnetic field flowing through it, in the direction of its longitudinal extension, if at all. Since the shape memory element has a high magnetic resistance and is developed to be very long in the axial direction, only a very weak magnetic field can be induced in the shape memory element. In response to the magnetic field that is weak at most, the shape memory element can generate only a very slight lift of the valve needle. In addition, the mechanical stress condition is unfavorable in response to applying the magnetic field in a cylindrically developed shape memory element. This stands in the way of lift development.

SUMMARY

By contrast, a device according to an example embodiment of the present invention, may have the advantage that, in a simple way, an improvement is achieved to the extent that a strong magnetic field is conducted through the shape memory element, and in this manner a long control stroke travel can be achieved in that the at least one shape memory element is essentially situated only in at least one through opening. In this way, functional magnetic transitions in the magnetic circuit are achieved. Because of this arrangement of the at least one shape memory element it is achieved that the shape memory element expands towards the actuator. The shape memory element is also positioned in such a way that, when the magnetic field is applied, none of the elongation directions of the shape memory element is interfered with.

It is particularly advantageous if, in the first through opening facing the actuator, there is situated at least one shape memory element, since the shape memory element is able to act directly on the actuator in this way.

It is also advantageous if, in addition, in a second through opening facing away from the actuator, at least one additional shape memory element is provided, which is connected to an assigned shape memory element of the first through opening, via a nonconductive connecting piece. In this way, a series connection of the shape memory elements is achieved, so that the lift transmitted to the actuator comes about from the addition of the control stroke travel of the shape memory element of the first through opening to the control stroke travel of the shape memory elements of the second through opening.

It may be very advantageous if, starting from the shape memory element of the first through opening, at least one magnetic conductive element runs all the way into the second through opening. According to a first exemplary embodiment, the magnetic conductive piece is connected to the magnet housing via the second through opening. According to a second embodiment, an additional shape memory element is situated in the second through opening, and the magnetic conductive piece is connected to it. In both embodiments, the magnetic circuit is closed by the magnetic conductive piece.

Moreover, it may be advantageous if the magnetic conductive piece is situated in the through openings, radially within the shape memory elements. Since magnetic lines of force flow through the shape memory elements because of the positioning transversely to the actuating axis, a control stroke travel of the shape memory elements comes about by extension in the direction of the actuating axis. This makes possible, for instance, the development of a fuel injector valve that opens outwards.

Furthermore, it may be advantageous if the shape memory element and the magnetic conductive piece is prestressed in the respective through opening by a spring element in the radial direction with respect to the actuating axis, since in this way an especially good contact, having only slight air gaps, can be achieved between the magnet housing, the shape memory elements and the magnetic conductive piece, so that a magnetic field develops, having a high field strength.

In line with the advantageous embodiments, the at least one shape memory element is designed to be sleeve-shaped, annular, shaped like a right parallelepiped or the like.

In addition, it may be advantageous if a coupler is provided which compensates for different thermal expansions of components of the device. It is ensured in this way that the control stroke travel of the shape memory elements is not dependent on temperature influences.

BRIEF DESCRIPTION OF THE DRAWINGS

Exemplary embodiments of the present invention are depicted in simplified fashion in the figures and explained in greater detail below.

DETAILED DESCRIPTION OF EXAMPLE EMBODIMENTS

Figure 1:
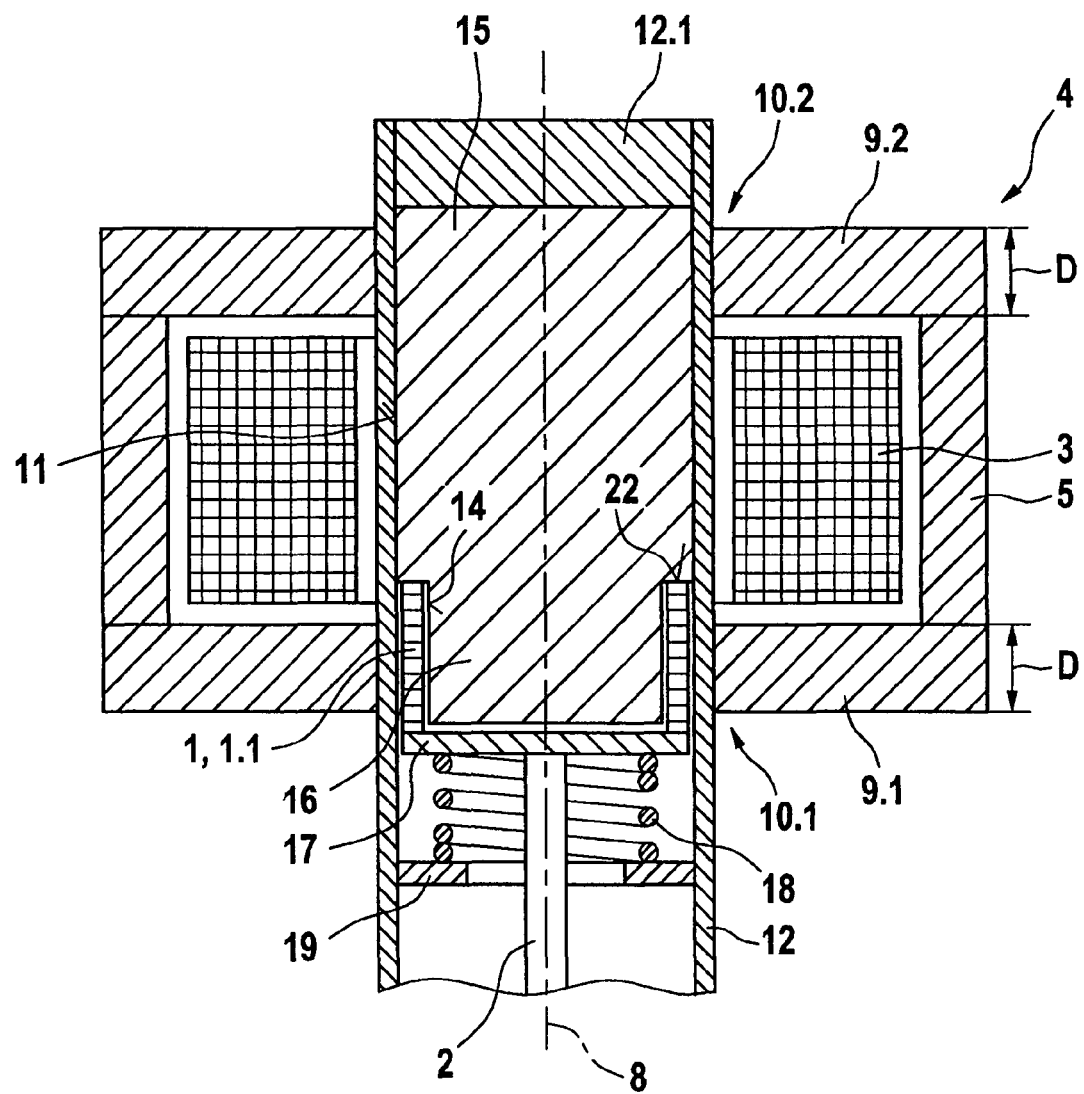
FIG. 1 shows in section, a first exemplary embodiment of the device according to the present invention.

FIG. 1 shows a simplified view of a first exemplary embodiment of a device according to the present invention, having an actuator and a shape memory element. The device is used to operate the actuator using the lift of the shape memory element. The device is, for example, any valve, for instance, a fuel injector valve, and the actuator is a valve needle or a valve pin.

The example device according to the present invention has at least one shape memory element 1, which as an actuator operates an assigned actuator 2. The at least one shape memory element 1 is made up of a so-called shape memory alloy, for instance, a magnetic shape memory alloy.

When a magnetic field is applied, shape memory element 1 carries out a control stroke travel operating actuator 2, by contracting in the direction of the magnetic lines of force of the magnetic field and expanding in a direction transverse to the magnetic lines of force. A third direction remains neutral. According to the first exemplary embodiment, shape memory element 1 is developed to be sleeve-shaped or annular, for example. Because of the thin-walled execution, the contraction of the at least one shape memory element 1 in the direction of the magnetic lines of force remains largely unimpeded.

The magnetic field is generated using an electric coil 3, for example, which is situated in a magnet housing 4. Magnetic housing 4, for example, has a cylinder-shaped axial section 5 which runs in the axial direction with respect to an actuating axis 8. Axial section 5 of magnet housing 4 is bordered in each case at its end face by a front wall running in the radial direction with respect to actuating axis 8, a first front wall 9.1 and a second front wall 9.2. Coil 3, that is developed in annular fashion, is situated in magnet housing 4, for instance, concentrically with respect to actuating axis 8. At least one of front walls 9.1, 9.2 has a through opening 10 radially within coil 3. First front wall 9.1 has, for example, a first through opening 10.1, and second front wall 9.2 has a second through opening 10.2. The axial length of through openings 10.1, 10.2 with respect to actuating axis 8 is defined by thickness D of front walls 9. Through openings 10.1, 10.2 are at a distance from each other in the axial direction, with respect to actuating axis 8. Between the two through openings 10, a housing channel 11 is provided, for example. Housing channel 11 is formed, for example, by a housing section 12, which runs through the two through openings 10, and is developed cylindrically, for example. The at least one shape memory element 1 and actuator 2 are situated in housing section 12. Housing section 12 is designed so that no relevant magnetic flux is conducted over it. This can be achieved, for example, by a thin-wall design or magnetically non-conductive materials.

According to an example embodiment of the present invention, shape memory element(s) 1 is/are positioned only through opening(s) 10.1, 10.2. Shape memory element(s) 1 is/are positioned in housing section 12 in such a way that, with respect to its longitudinal extension with respect to actuating axis 8, they are generally located only in through openings 10, or in the axial region of through openings 10. Advantageously, shape memory element(s) 1 are positioned completely or exclusively in through opening(s) 10.1, 10.2.

According to the first exemplary embodiment, in first through opening 10.1 facing actuator 2 there is a shape memory element 1.1, which is developed to be sleeve-shaped or shaped like a parallelepiped, for example. Starting from shape memory element 1.1 of first through opening 10.1, a magnetic conductive piece 15 runs all the way into second through opening 10.2. Magnetic conductive piece 15 is situated in first through opening 10.1, radially within shape memory element 1.1 with respect to actuating axis 8, in that it (magnetic conductive piece 15), starting from second through opening 10.2, reaches all the way to shape memory element 1 in the axial direction, and extends with its offset 16 into a recess 14 in shape memory element 1.1. In this way, an axial support is achieved of shape memory element 1.1. As seen in the radial direction with respect to actuating axis 8, between offset 16 and shape memory element 1, and between shape memory element 1 and housing section 12, a gap is provided that is as small as possible. Shape memory element 1.1 lies with one end face against a second shoulder 22 of offset 16 and acts with the other end face on a third shoulder 17, for example, of actuator 2. Magnetic conductive piece 15 is provided to be immovable in housing section 12, and, for example, fixedly connected to housing section 12. Housing section 12 is closed, for example, by a housing cover 12.1 at its end face facing away from actuator 2. At its end face facing away from shape memory element 1.1, magnetic conductive piece 15 lies against housing cover 12.1, for example. If shape memory element 1 extends transversely to the magnetic lines of force, shape memory element 1.1 supports itself on second shoulder 22 of offset 16 and transfers the control stroke travel to actuator 2, in a direction facing away from shoulder 22.

A resetting spring 18 is situated in housing section 12, which is supported at one end at a mounting support 19 of housing section 12, and which acts on actuator 2 at its other end, for instance via third shoulder 17, in a resetting manner. Since third shoulder 17 of actuator 2 lies against shape memory element 1.1, resetting spring 18 presses shape memory element 1.1 against second shoulder 22 of offset 16.

Figure 2:
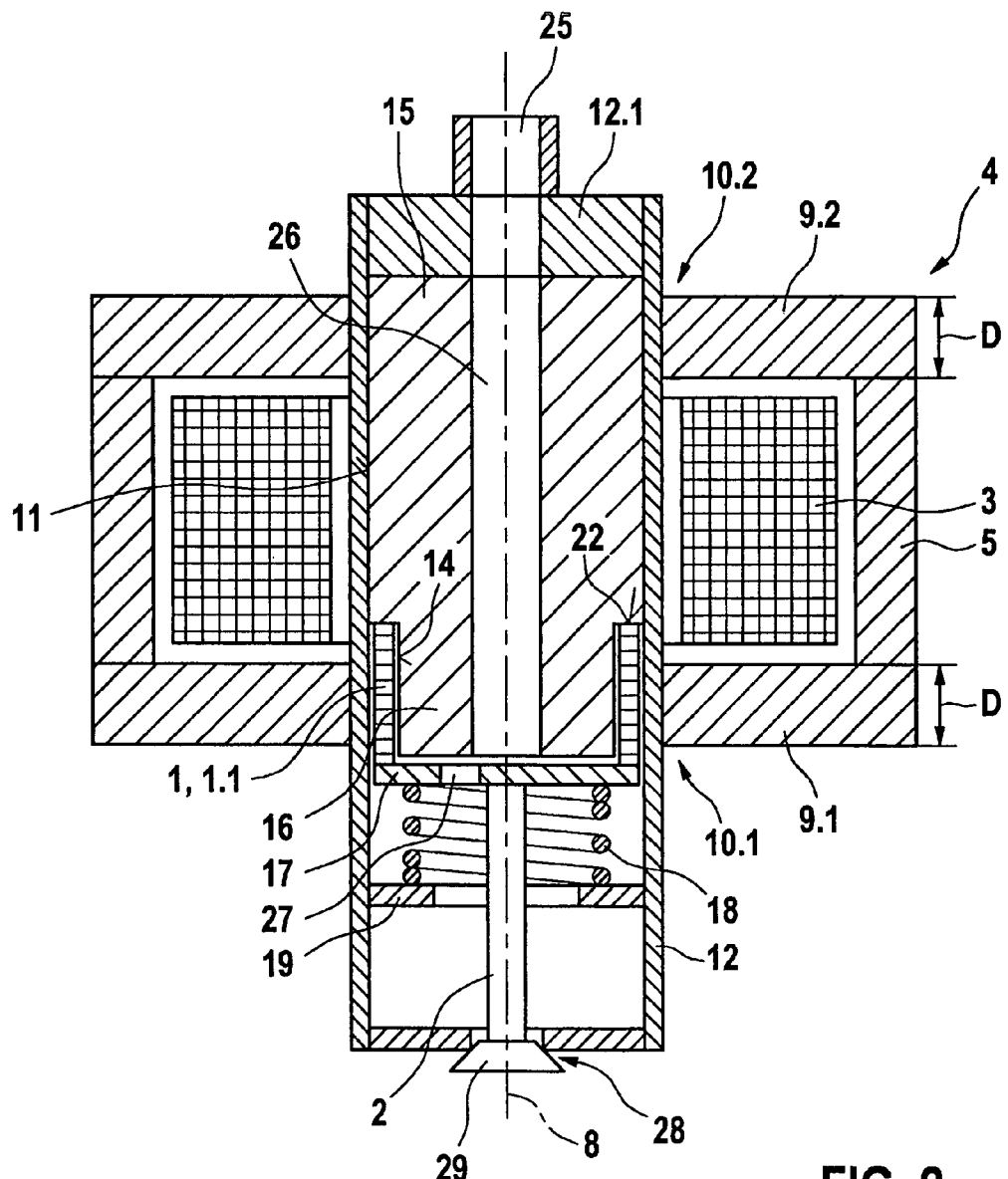
FIG. 2 shows a fuel injector valve according to the first exemplary embodiment.

In response to switching on electrical coil 3, a magnetic field is generated whose magnetic lines of force run via axial section 5, first front wall 9.1, a wall of housing channel 11 in second through opening 10.2 and second front wall 9.2. Shape memory element 1 contracts, in the process, in the direction of the magnetic lines of force, and expands transversely to this in the direction of actuating axis 8. FIG. 2 shows a fuel injector according to the first exemplary embodiment of the device according to the present invention.

In the device according to FIG. 2, the parts that remain unchanged or act in the same manner as those in the device according to FIG. 1 are characterized by the same reference numerals.

The fuel injector has an inlet 25 for fuel. Actuator 2 is developed as a valve needle, and has a closing member 29 that acts together with a valve seat 28. The fuel injector is developed, for instance, as a valve that opens outwards, that is closed at zero current, and that opens using valve needle 2 in the direction facing away from shape memory element 1. However, the fuel injector may also be designed as a valve opening towards the inside, that is opened at zero current. Downstream from inlet 25, the fuel proceeds into housing section 12 and all the way to valve seat 28, via a fuel line 26 provided in magnetic conductive piece 15 and a connecting opening 27 situated in third shoulder 17. When the fuel injector is open, the fuel is injected from housing section 12, via an opening gap between valve seat 28 and closing body 29, into a combustion chamber of an internal combustion engine.

Figure 3:
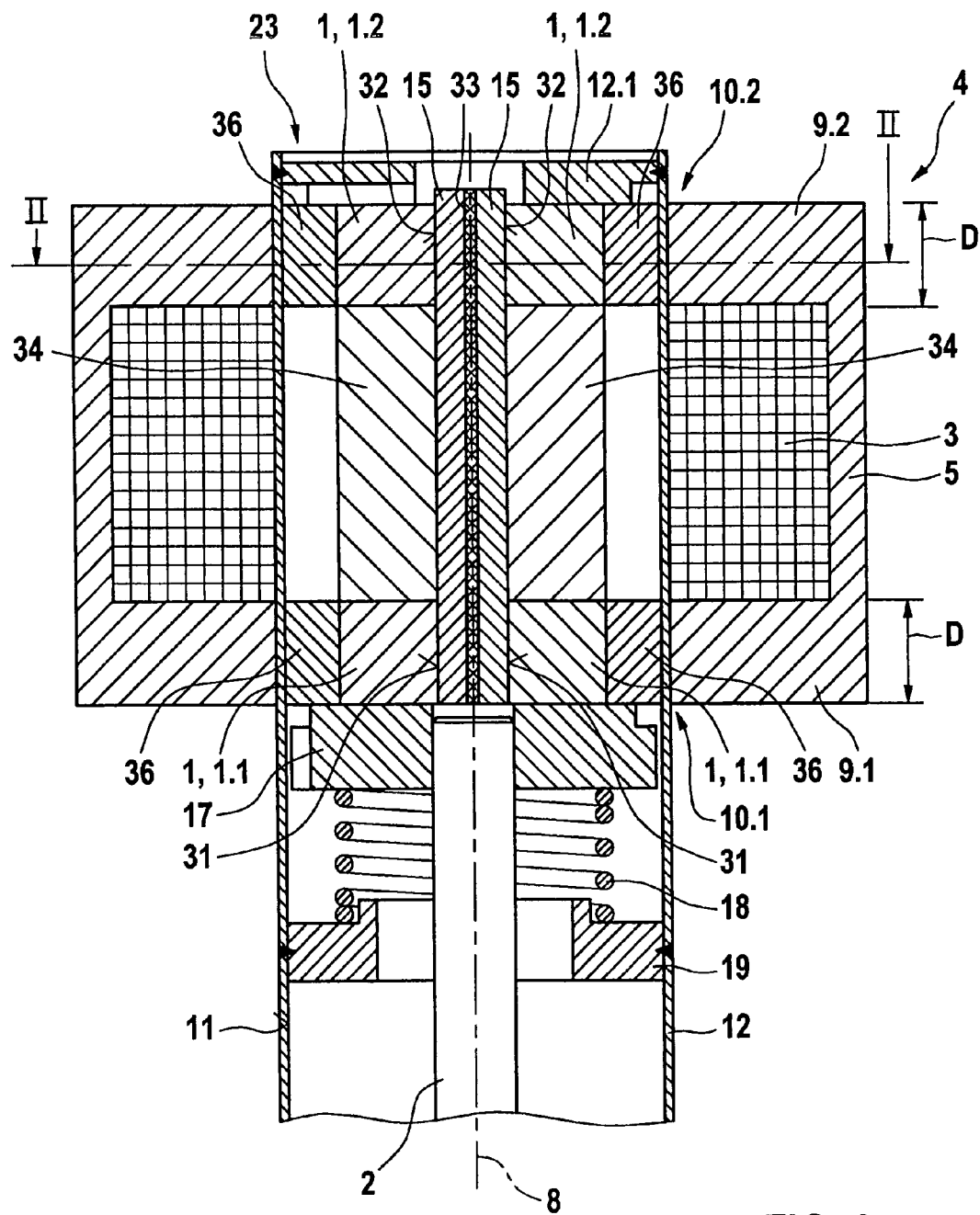
FIG. 3 shows in section, a second exemplary embodiment.

In section, FIG. 3 shows a simplified view of a second exemplary embodiment of the device according to the present invention.

In the device according to FIG. 3, the parts that remain unchanged or act in the same manner as those in the device according to FIGS. 1 and 2 are characterized by the same reference numerals.

The device as in FIG. 3 differs from the device as in FIGS. 1 and 2 in that at least one shape memory element 1.2 is situated not only in first through opening 10.1 but also in both through openings 10.1, 10.2.

According to the second exemplary embodiment, at least one additional shape memory element 1.2 is provided, in second through opening 10.2 that faces away from actuator 2, which is connected to the assigned shape memory element 1.1 of first through opening 10.1 via a magnetically non-conductive connecting piece 34. A connecting device 34 runs in the direction of actuating axis 8. Because of shape memory elements 1 coupled in each case by connecting device 34 and situated one above the other, a series connection of shape memory elements 1 is achieved, so that the lift transferred to actuator 2 comes about from the addition of the control stroke travel of shape memory elements 1.1 from first through opening 10.1 to control stroke travel of shape memory elements 1.2 from second through opening 10.2. Shape memory elements 1.1, 1.2 of a through opening 10.1, 10.2 are connected in parallel, so that it is not their control stroke travels, but their actuating forces that add together.

For instance, two shape memory elements 1.1, 1.2 are provided in each case in each through opening 10.1, 10.2. These are provided, for example, completely and exclusively in through openings 10.1, 10.2. In addition, two connecting pieces 34 and magnetic conductive pieces 15 are situated in housing section 12 which, in each case, connect a shape memory element 1.1 of first through opening 10.1 to a shape memory element 1.2 of second through opening 10.2. Magnetic conductive pieces 15 are situated between shape memory elements 1.1, 1.2. Between housing section 12 and shape memory elements 1, in the area of through openings 10.1, 10.2 there is situated in each case an intermediate piece 36, in order to contact together parallelepiped-shaped shape memory elements 1 with cylindrically shaped housing section 12 and magnet housing 4. For example, two intermediate pieces 36 are situated in each through opening 10.1, 10.2. Intermediate pieces 36 are magnetically conductive, and are designed as annular segment shapes. They can also be developed in one piece at housing channel 11. According to the arrangement described, there comes about a stack having three layers, of which the outer layers are formed by the two shape memory elements 1 and the two intermediate pieces 36, respectively, and the middle layer has the two connecting device 34. The two outer layers are connected to each other by magnetic conductive pieces 15. The three-layer arrangement is designated as actuator package 23.

Magnetic conductive pieces 15 run in each case from one first inner side 31 of shape memory element 1.1 of first through opening 1.1 to a second inner side 32 of additional shape memory element 1.2 of second through opening 10.2. The two magnetic conductive pieces 15 may also be designed as a single magnetic conductive piece 15.

Connecting pieces 34 in each case connect the facing sides of a shape memory element 1.1 of first through opening 10.1 and of a shape memory element 1.2 of second through opening 10.2.

Shape memory elements 1.1, 1.2 are shaped, for instance, like a parallelepiped, a cube, or the like, and magnetic conductive pieces 15 are plate-shaped, for example.

Shape memory elements 1 and magnetic conductive pieces 15 are prestressed in their respective through opening 10.1, 10.2, for instance, by a spring element 33 in the radial direction with respect to actuating axis 8. In this way, a particularly good contact is achieved without air gap between magnet housing 4, shape memory elements 1 and magnetic conductive piece 15, so that a magnetic field develops that has high field strength. In the second exemplary embodiment, a prestressed elastic intermediate layer is provided as spring element 33, between magnetic conductive pieces 15, and it presses shape memory elements 1 radially outwards with respect to actuating axis 8, against housing section 12.

Shape memory elements 1 of second through opening 10.2 lie with their upper side, that faces away from actuator 2, for example, against housing cover 12.1, which is rigidly connected to housing section 12. Shape memory elements 1 and connecting device 34 are positioned to be axially movable, in the direction facing away from housing cover 12.1, in order to transfer the lift of shape memory elements 1 to actuator 2.

Third shoulder 17 of actuator 2 lies against shape memory elements 1.1 of first through opening 10.1. Resetting spring 18 is supported at its end on mounting support 19 of housing section 12, and at the other end it acts on third shoulder 17 of actuator 2, and presses shape memory elements 1, of through openings 10.1, 10.2, using connecting device 34, in the direction of housing cover 12.1.

When electric coil 3 is switched on, a magnetic field is generated whose magnetic lines of force run via axial section 5, first front wall 9.1, a wall of housing section 12 in first through opening 10.1, one of intermediate pieces 36 of first through opening 10.1, shape memory element 1.1 of first through opening 10.1, magnetic conductive piece 15, shape memory element 1.2 in second through opening 10.2, one of intermediate pieces 36 of second through opening 10.2, a wall of housing channel 11 in second through opening 10.2 and second front wall 9.2. Shape memory element 1 contracts, in the process, in the direction of the magnetic lines of force, and expands transversely to this in the direction of actuating axis 8.

The device according to the second exemplary embodiment may also be developed as a fuel injector having a valve needle 2 as actuator.

Figure 4:
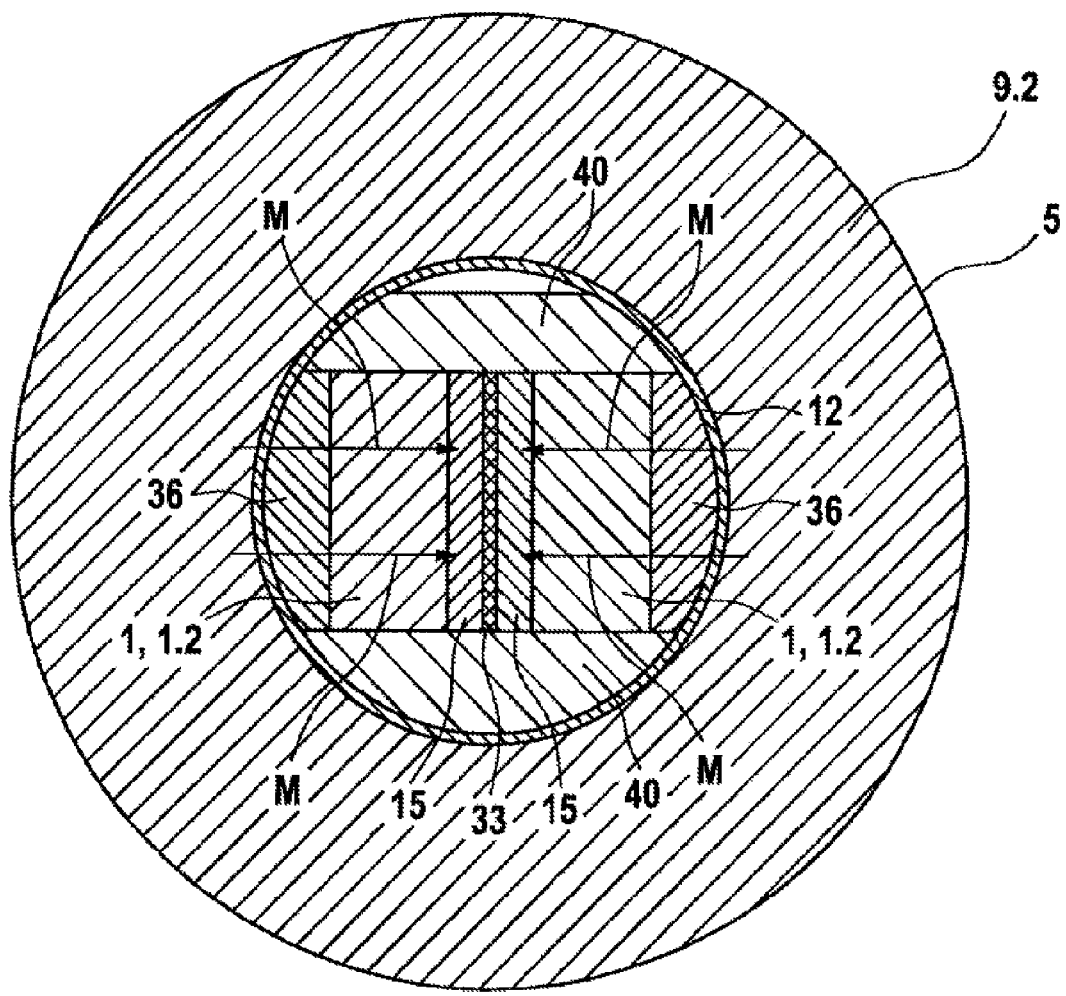
FIG. 4 shows a sectional view of the second exemplary embodiment along line II-II in FIG. 1.

FIG. 4 shows a sectional view of the second exemplary embodiment, along line II-II in FIG. 1.

In the device according to FIG. 4, the parts that remain unchanged or act in the same manner as those in the device according to FIGS. 1 through 3 are characterized by the same reference numerals.

In housing section 12 that is circular, for example, the parallelepiped-shaped shape memory elements 1 are situated, together with plate-shaped magnetic conductive pieces 15 and elastic intermediate layer 33, centrically with respect to actuating axis 8. Annular segment-shaped intermediate pieces 36 close the magnetic circuit between shape memory elements 1 and housing section 12, in that they lie against shape memory elements 1 on one side and against the wall of housing section 12. In the cross section, the magnetic lines of force run corresponding to the arrows M that are drawn in.

In cylindrical housing section 12 there are provided, besides, magnetically non-conductive spacer pieces 40 for fixing the position of shape memory elements 1, magnetic conductive pieces 15 and intermediate pieces 36.

Figure 5:
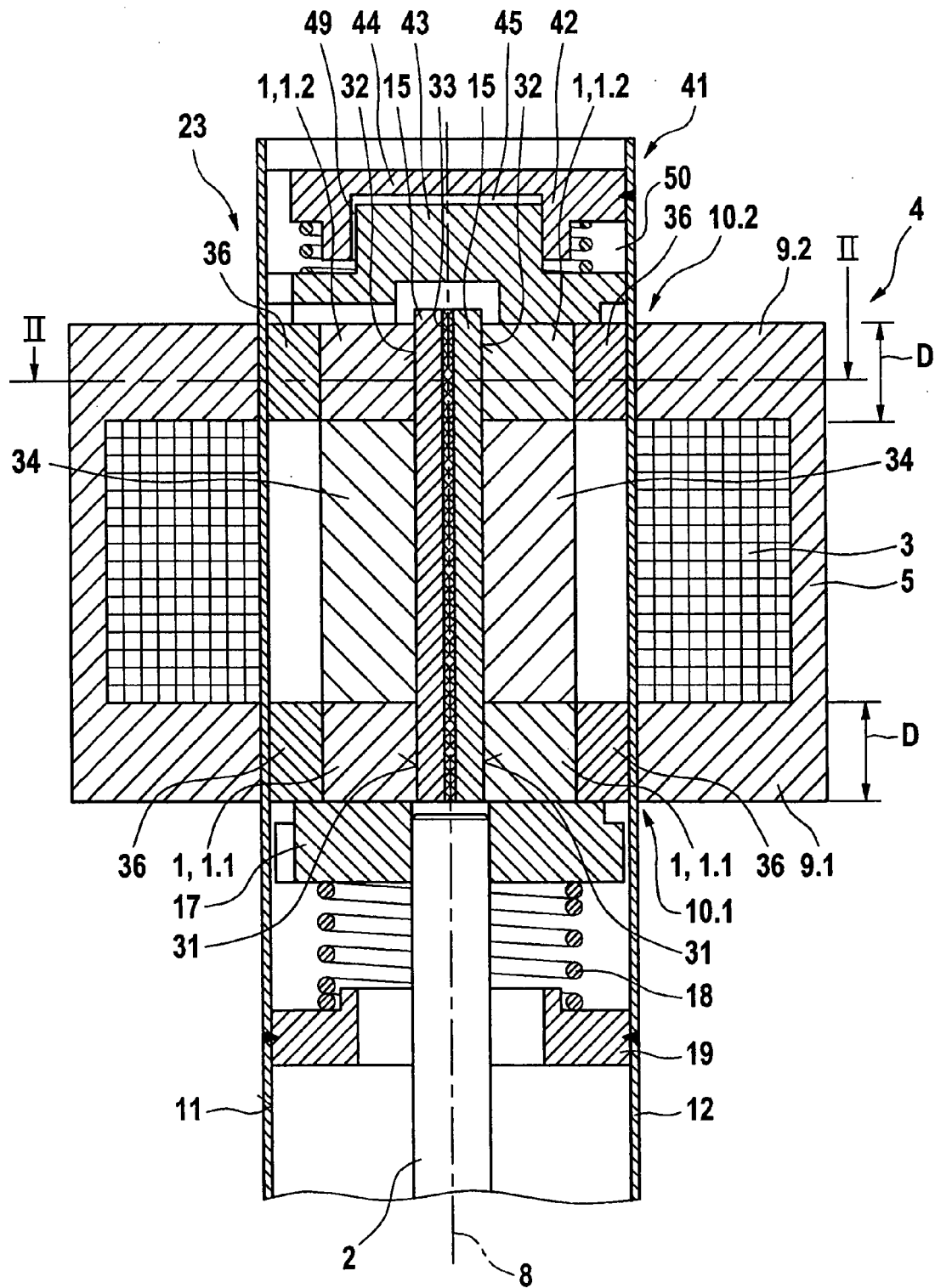
FIG. 5 shows in section, a third exemplary embodiment.

FIG. 5 shows a simplified view of a third exemplary embodiment.

In the device according to FIG. 5, the parts that remain unchanged or act in the same manner as those in the device according to FIGS. 1 through 4 are characterized by the same reference numerals.

The device according to FIG. 5 differs from the device as in FIG. 3 in that a coupler 41 which compensates for different thermal expansions in the device.

Coupler 41 is designed, for example, as a hydraulic coupler. Coupler 41 includes a pot-shaped cylinder 42, for example, and a piston 43 which is axially displaceable in cylinder 42. Between a pot floor 44 of cylinder 42, a coupler gap 45 filled with fluid is provided. Coupler 41 is situated, for instance, on the side of actuator package 23 facing away from actuator 2. Actuator package 23 is supported on piston 43. In displacement processes acting rapidly on hydraulic coupler 41, such as, for instance, in the expansion of shape memory elements 1 in response to the application of a controllable magnetic field, hydraulic coupler 41 reacts as an extremely rigid component, since barely any fluid is able to escape out of coupler gap 45 within the short period of time. Thus, since coupler gap 45 remains constant, the control stroke travel of shape memory elements 1 is transferred completely to actuator 2. In displacement processes that act slowly on hydraulic coupler 41, such as the expansion in response to temperature changes, coupler gap 45 becomes smaller or larger since the fluid has enough time to flow out of or into coupler gap 45.

Coupler gap 45 is flow-connected to a compensation chamber 50 that is filled with liquid, via a leakage gap 49 or a throttle. It may be filled with fuel or with a separate fluid.

Figure 6:
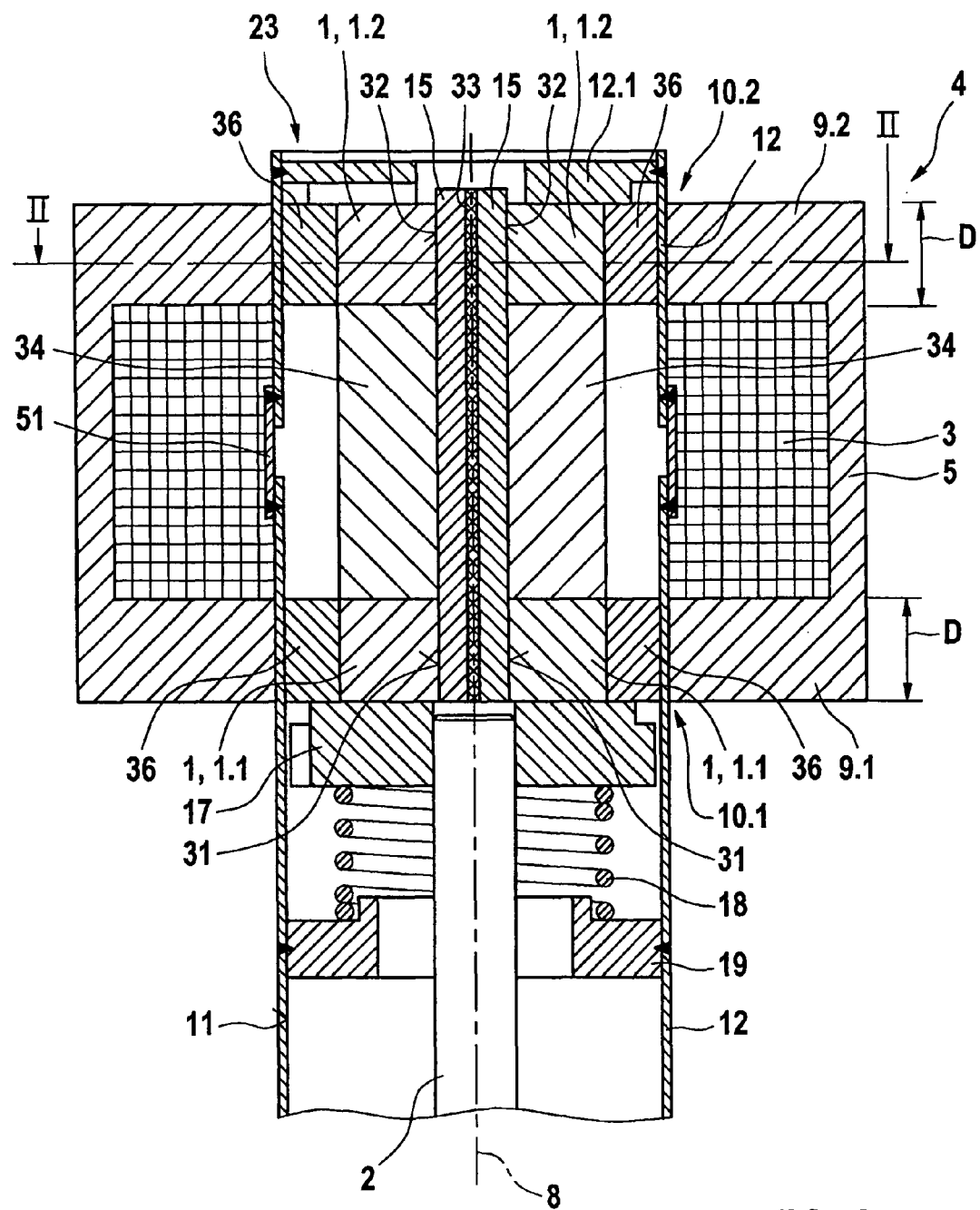
FIG. 6 shows a fourth exemplary embodiment.

FIG. 6 shows a simplified view of a fourth exemplary embodiment.

In the device according to FIG. 6, the parts that remain unchanged or act in the same manner as those in the device according to FIGS. 1 through 5 are characterized by the same reference numerals.

The device according to FIG. 6 differs from the device as in FIG. 5 in that no coupler is provided, but different thermal expansions in the device are avoided by a specific selection of the thermal coefficient of expansion of a compensating element 51, provided at housing section 12.

In the fourth exemplary embodiment, housing section 12 is separated into two sections which are rigidly connected to each other via compensating element 51. Since the thermal coefficients of expansion of housing section 12 and shape memory elements 1 are different, the coefficient of thermal expansion of compensating element 51 is selected in such a way that no thermal expansion difference, or only a slight one, comes about between housing section 12 and shape memory elements 1.

Figure 7:
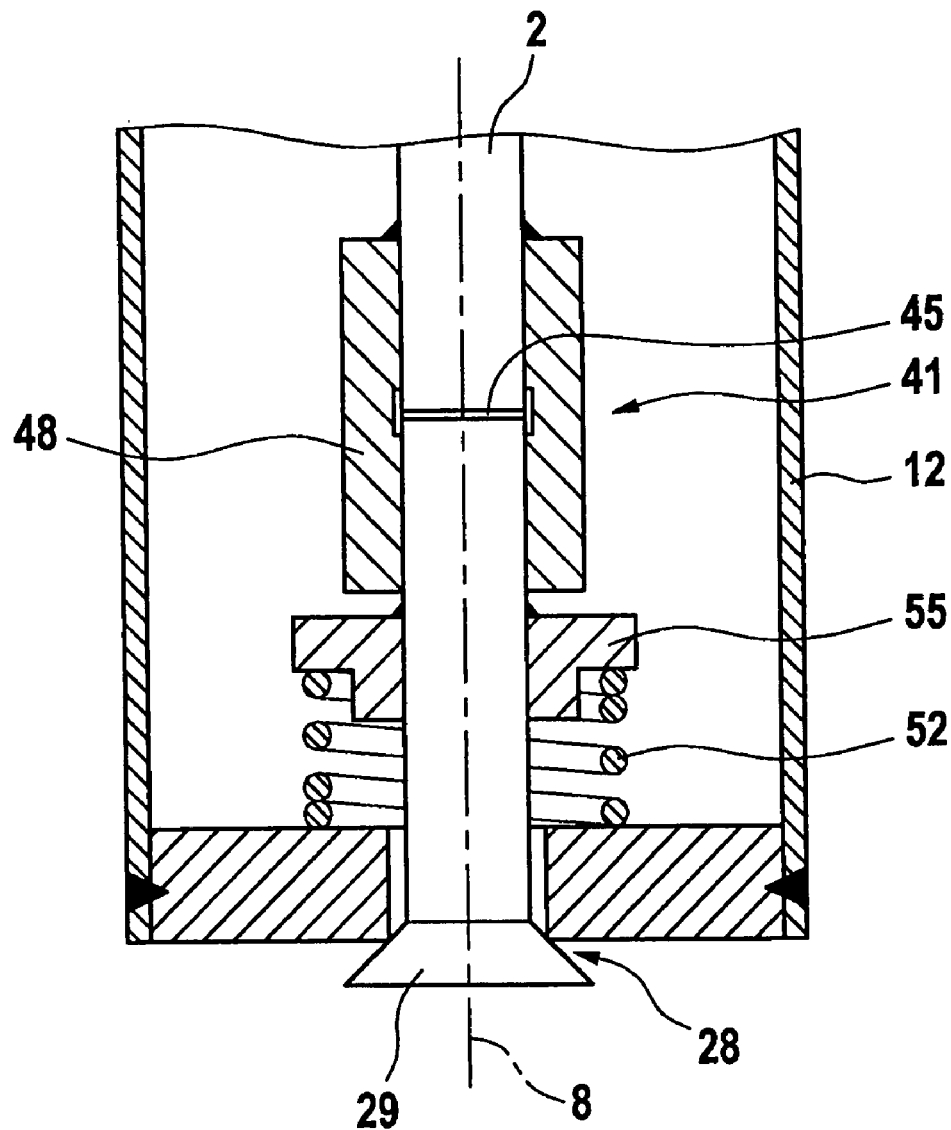
FIG. 7 shows a fifth exemplary embodiment of the device according to the present invention.

FIG. 7 shows a simplified view of a fifth exemplary embodiment.

In the device according to FIG. 7, the parts that remain unchanged or act in the same manner as those in the device according to FIGS. 1 through 6 are characterized by the same reference numerals.

The device according to FIG. 7 differs from the device as in FIG. 5 in that coupler 41 is not situated on the side of actuator package 23 facing away from actuator 2, but rather is provided on actuator 2. Valve needle 2 and closing member 28 are developed in two parts and separated from each other. Coupler 41 is formed by a cylindrical sleeve 48, into which valve needle 2 and closing member 29 extend. Cylindrical sleeve 48 and the end faces of valve needle 2 and of closing member 29 in this way border fluid-filled coupler gap 45. Closing member 29 is pressed by a spring 52 in the direction of a valve seat 28. At its one end, spring 52 is supported on housing section 12, and with the other end it acts on closing member 29 via a fourth shoulder 55.

What is claimed is:

1. A device, comprising:
   an actuator having an actuating axis;
   at least one shape memory element which, by the application of a controllable magnetic field, executes a control stroke travel that operates the actuator, wherein the at least one shape memory element has a planar wall structure extending parallel to the actuating axis; and
   a coil that excites the magnetic field, the coil being situated in a magnet housing, wherein the magnet housing has a first end face and a second end face extending perpendicular to the actuating axis, and wherein at least one of (i) the first end face has a first through opening, and (ii) the second end face has a second through opening, and wherein the coil is positioned between the first and second end faces and radially wound around the actuating axis, and when viewed along the actuating axis, the coil radially surrounds at least one of the first through opening and the second through opening;
   wherein the at least one shape memory element is at least partially situated in the at least one of the first and second through openings.

2. The device as recited in claim 1, wherein the at least one shape memory element is situated in the first through opening, and wherein the first through opening directly faces the actuator.

3. The device as recited in claim 2, wherein the second through opening is further away from the actuator than the first through opening, and a further shape memory element is connected via a non-conductive connecting piece to the at least one shape memory element.

4. The device as recited in claim 2, further comprising:
   at least one magnetic conductive piece which extends from the at least one shape memory element of the first through opening into the second through opening.

5. The device as recited in claim 4, wherein the magnetic conductive piece is connected to the magnet housing via the second through opening.

6. The device as recited in claim 4, wherein a further shape memory element is situated in the second through opening, and the magnetic conductive piece is connected to the further shape memory element.

7. The device as recited in claim 4, wherein the magnetic conductive piece is situated in the first and second through openings, and at least a portion of the magnetic conductive piece is radially surrounded by the at least one shape memory element.

8. The device as recited in claim 4, wherein a further shape memory element is situated in the second through opening, and the shape memory elements and the magnetic conductive piece are stressed along a direction perpendicular to the actuating axis by a spring element.

9. The device as recited in claim 1, wherein the at least one shape memory element is sleeve-shaped, annular or parallelepiped.

10. The device as recited in claim 1, wherein a coupler is provided which compensates for different thermal expansions in the device, the coupler being positioned along the actuating axis near one of the first through opening or the second through opening.

* * * * *